(12) United States Patent
Iwai

(10) Patent No.: US 8,110,966 B2
(45) Date of Patent: Feb. 7, 2012

(54) PIEZOELECTRIC FRAMES AND PIEZOELECTRIC DEVICES COMPRISING SAME

(75) Inventor: Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 245 days.

(21) Appl. No.: 12/592,828

(22) Filed: Dec. 2, 2009

(65) Prior Publication Data

US 2010/0164328 A1 Jul. 1, 2010

(30) Foreign Application Priority Data

Dec. 2, 2008 (JP) .................................. 2008-307481

(51) Int. Cl.
*H03H 9/19* (2006.01)
*H03H 9/21* (2006.01)
*H03H 9/215* (2006.01)

(52) U.S. Cl. ....................................... 310/370; 310/344

(58) Field of Classification Search .................. 310/370, 310/348, 344
See application file for complete search history.

(56) References Cited

U.S. PATENT DOCUMENTS

| | | | |
|---|---|---|---|
| 7,592,741 B2 | 9/2009 | Tanaya et al. | |
| 8,018,126 B2 * | 9/2011 | Umeki et al. | 310/344 |
| 2009/0212668 A1 * | 8/2009 | Sugiyama | 310/370 |
| 2010/0156246 A1 * | 6/2010 | Iwai | 310/344 |
| 2011/0068876 A1 * | 3/2011 | Yamada et al. | 331/158 |

FOREIGN PATENT DOCUMENTS

| | | |
|---|---|---|
| JP | S54-58395 | 5/1979 |
| JP | 2004-208237 | 7/2004 |
| JP | 2006-303761 | 11/2006 |
| JP | 2006-352771 | 12/2006 |
| JP | 2007-096900 | 4/2007 |
| JP | 2007-165503 | 6/2007 |
| JP | 2007-243535 | 9/2007 |
| JP | 2007-258910 | 10/2007 |
| JP | 2008-109676 | 5/2008 |
| JP | 2008-177723 | 7/2008 |
| JP | 2008-182665 | 8/2008 |
| JP | 2009060347 A * | 3/2009 |
| JP | 2009164777 A * | 7/2009 |
| JP | 2009165006 A * | 7/2009 |
| JP | 2010103950 A * | 5/2010 |
| JP | 2010147666 A * | 7/2010 |
| JP | 2010183136 A * | 8/2010 |
| JP | 2011087272 A * | 4/2011 |

* cited by examiner

*Primary Examiner* — Jaydi San Martin
(74) *Attorney, Agent, or Firm* — Klarquist Sparkman, LLP

(57) ABSTRACT

Piezoelectric frames are disclosed that include a tuning-fork type piezoelectric vibrating piece. The vibrating piece has at least a pair of vibrating arms that extend in a longitudinal direction (e.g., Y-direction) from a first end edge of a piezoelectric base, and at least one excitation electrode on the pair of vibrating arms. Respective supporting arms extend in the longitudinal direction, outboard of each vibrating arm. The vibrating piece is surrounded by and attached to a frame portion also made of piezoelectric material. A pair of connecting portions connects the supporting arms to the frame portion. The connecting portions extend from respective supporting arms to the frame portion in a direction that intersects the longitudinal direction. The connecting portions are connected to the frame portion at designated locations that are more than 50% of the designated length of the vibrating piece from the second end edge of the base.

19 Claims, 8 Drawing Sheets

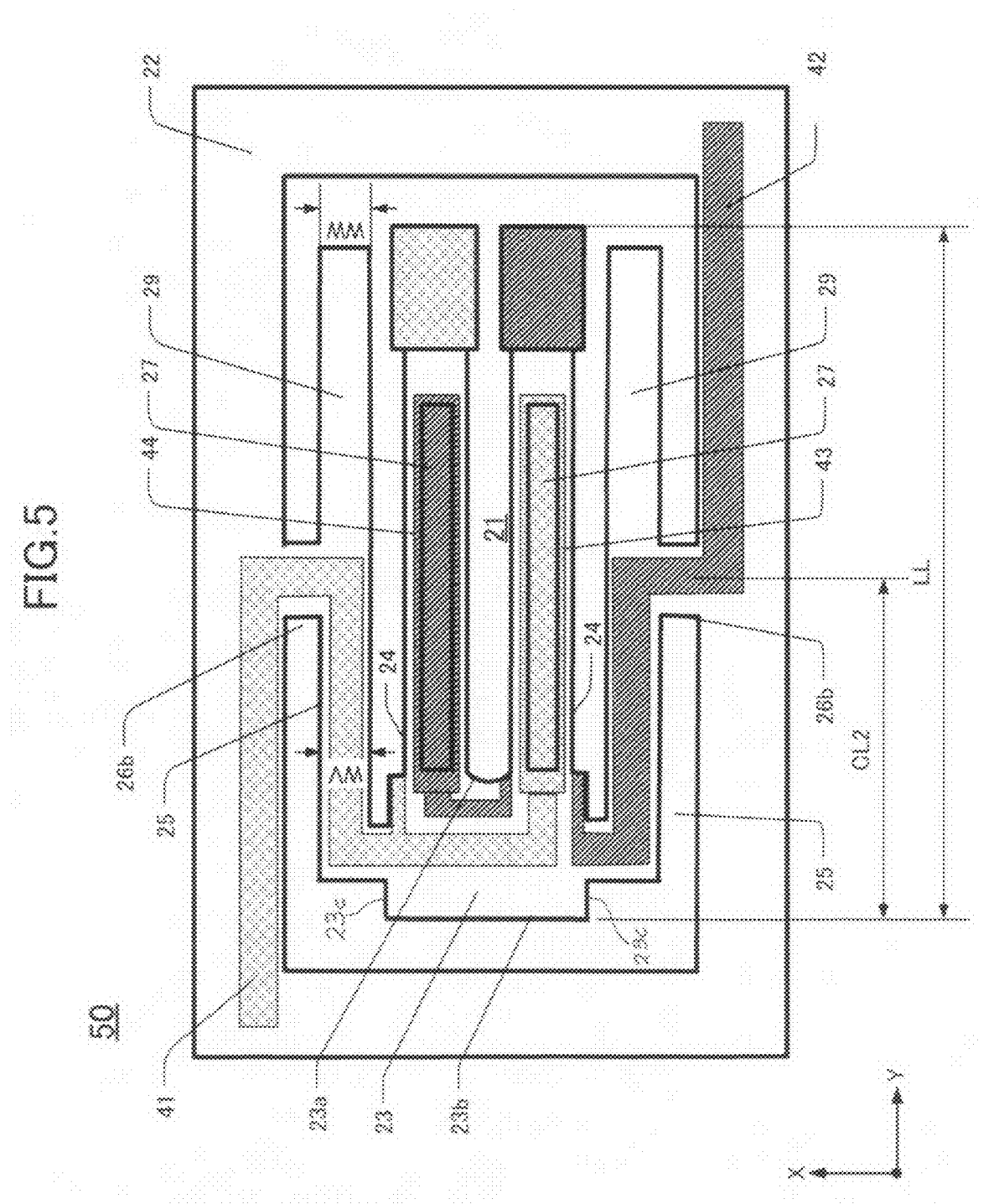

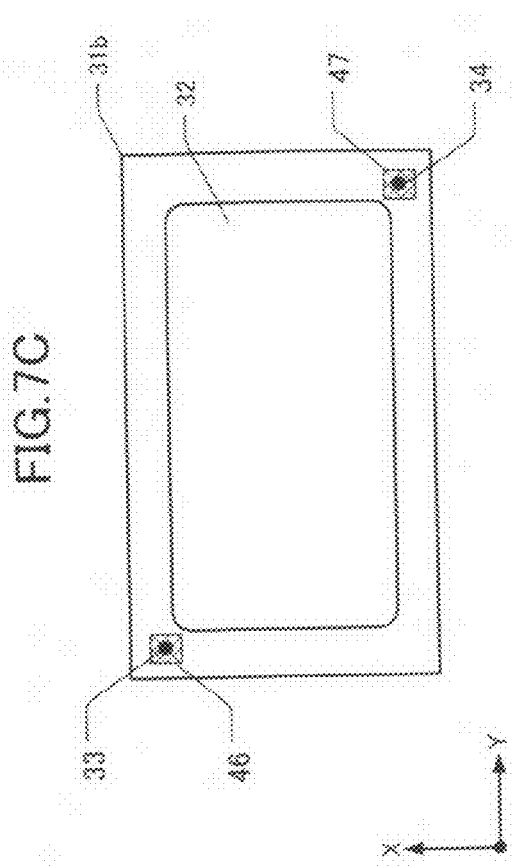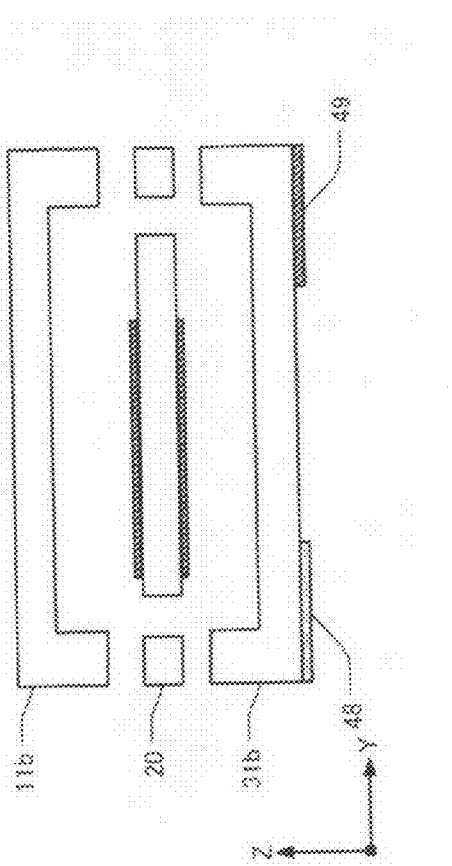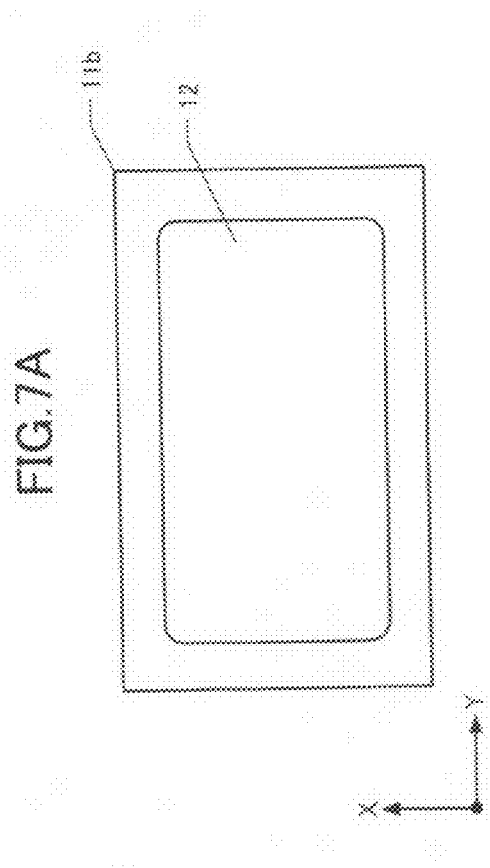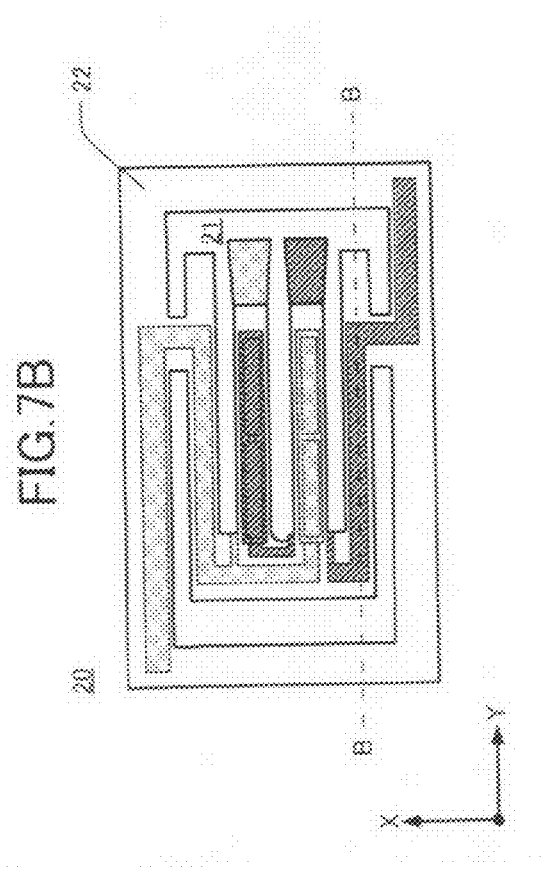

PIEZOELECTRIC FRAMES AND PIEZOELECTRIC DEVICES COMPRISING SAME

CROSS-REFERENCE TO RELATED APPLICATION

This application claims priority to and the benefit of Japan Patent Application No. 2008-307481, filed on Dec. 2, 2008, in the Japan Patent Office, the disclosure of which is incorporated herein by reference in its entirety.

FIELD

This disclosure is directed to, inter alia, techniques for manufacturing piezoelectric frames and piezoelectric devices comprising tuning-fork type oscillators mounted to a piezoelectric base made of a crystal material.

DESCRIPTION OF THE RELATED ART

With the progress of miniaturization and/or increases in the operating frequency of mobile communication apparatus and office automation (OA) equipment, piezoelectric vibrators used in this equipment must be progressively smaller. Also required are piezoelectric vibrators that can be surface-mounted on circuit boards. For miniaturization, a piezoelectric device desirably is configured as a piezoelectric vibrating piece (termed herein a "tuning-fork type piezoelectric vibrating piece"). A tuning-fork type piezoelectric vibrating piece comprises tuning-fork type vibrating arms that extend from a base. To facilitate manufacture of a tuning-fork type piezoelectric vibrating piece that can be surface mounted and have a thinner profile, the tuning-fork type piezoelectric vibrating piece is formed concurrently with formation of a frame that surrounds the piece. This configuration can be miniaturized in the X-, Y-, and Z-directions and is amenable to mass production.

FIG. 8 depicts a piezoelectric vibrating frame 210 and integral tuning-fork piezoelectric vibrating piece 200, as disclosed in Japan Unexamined Patent Application No. 2004-208237. The tuning-fork type piezoelectric vibrating piece 200 is connected to the frame 201 by a first connecting portion 203 and second connecting portions 204 that extend from a base 202 in the X-direction and Y-directions, respectively. The first connecting portion 203 and second connecting portions 204 are connected generally to the −Y end of the frame 201 and to the −Y half of the base 202, rather than the +Y half 210 of the base 202. The vibrating arms 205 extend in the +Y-direction from the +Y half 210 of the base 202.

However, when miniaturized, the length of the frame 201 is not sufficient for forming connecting portions that can absorb vibrations from the tuning-fork type piezoelectric vibrating piece 200. Consequently, vibrations tend to leak from the device 220, which undesirably increases the CI of the device. Furthermore, because the device 220 is intended to be surface-mounted, it is easily adversely affected by the circuit board onto which the device is mounted.

In view of the above, an object of the invention is to provide piezoelectric devices that are stable and that are less affected adversely by external factors. This object is achieved by, inter alia, controlling the positions of the connecting portions of the frame and of supporting arms extending from the base.

SUMMARY

A piezoelectric frame according to a first aspect comprises a tuning-fork type piezoelectric vibrating piece comprising a base having a first end edge and a second end edge opposite the first end edge. At least a pair of vibrating arms extends in a first longitudinal direction from the first end edge of the base, and at least one excitation electrode is situated on the vibrating arms. The piezoelectric vibrating piece extends length and width in a plane in which the piezoelectric vibrating piece has a designated length in the plane from the second end edge of the base in the first longitudinal direction. The piezoelectric frame also includes a frame situated in the plane in which the frame is coupled to and surrounds the tuning-fork type piezoelectric vibrating piece. A respective supporting arm extends in the plane laterally from the base and in the first longitudinal direction, outboard of and parallel to the respective vibrating arm. A respective connecting portion connects each supporting arm to the frame. Each connecting portion extends in the plane from the frame to the respective supporting arm in a second direction intersecting the first longitudinal direction. The connecting portions are connected to the frame and respective supporting arms at designated locations that are more than 50% of the designated length of the tuning-fork piezoelectric vibrating piece from the second end edge of the base. This configuration reduces vibration leakage from the vibrating arms to external locations and provides good protection of the piezoelectric vibrating piece against external factors.

In one embodiment of the piezoelectric frame, each vibrating arm has a designated length to a respective distal-end edge in the first longitudinal direction. Each connecting portion further comprises a respective projecting supporting portion extending therefrom in the plane in the first longitudinal direction. Each projecting supporting portion extends in the first longitudinal direction a distance in which the projecting supporting portion does not extend past the distal-end edge of the respective vibrating arm. Whenever a connecting portion is located at a position more than 50% of the length of the piezoelectric vibrating piece from the second end edge of the base, the sides of the base become heavier and can cause undesired twisting stress. Also, such a configuration is not as resistant to external impacts. The projecting supporting portions reduce twisting stress at the connecting portions.

Each projecting supporting portion can have a mass that is adjustable to reduce twisting stress in the connecting portions. The adjustable mass provides essentially a balancer, and can be configured as a metal film. The adjusted mass controls weight and reduces the twisting stress at the connecting portion.

If each supporting arm is regarded as having a first width and each projecting supporting portion is regarded as having a second width, the second width desirably is different from the first width. The resulting greater width of the projecting supporting portions reduces twisting stress at the connecting portions.

In some embodiments, in which each vibrating arm has a respective distal end, each distal end includes a weight. These weights allow fine adjustment of the vibration frequency of the piezoelectric piece.

For energizing the tuning fork, many embodiments further comprise at least one connecting electrode extending on the supporting arms, the connecting portions, and the frame. The at least one connecting electrode is electrically connected to a respective excitation electrode. By thus providing the connecting electrode on the frame, easier connections can be made to external electrode(s) on the package base.

According to another aspect, piezoelectric devices are provided. An embodiment thereof comprises a piezoelectric frame as summarized above, wherein the frame has an upper surface and a lower surface. A package lid is attached to the upper surface so as to cover the piezoelectric frame. A package base is attached to the lower surface so as to form a sandwich of the frame between the lid and the package base. A piezoelectric device having this configuration exhibits reduced variation of CI value and reduced variation in vibration frequency before and after actual mounting the device on a printed circuit board. Thus, this configuration of a piezoelectric device oscillates accurately at a desired frequency, despite using the device in manufacturing processes.

In certain embodiments the lid and package base are made of a glass material including ions of a metal. The upper and lower surfaces of the frame comprise respective peripheral regions configured to contact the lid and package base, respectively, in the sandwich, wherein each peripheral region includes a metal film. The metal films are bonded to the lid and package base, respectively, by anodic bonding. The piezoelectric device having this configuration can be formed having lid and base materials that are formed of easily workable glass.

In other embodiments the lid and package base are each made of a piezoelectric material (as is the piezoelectric frame). In the sandwich the piezoelectric frame, lid, and package base are bonded together by siloxane bonding. Both embodiments allow many devices to be formed simultaneously by forming lids, package bases, and frames on respective wafers that are bonded together and then diced to separate individual devices.

In any event, tuning-fork type piezoelectric vibrating pieces as disclosed herein exhibit reduced leakage of vibrations and are less adversely affected by external factors. The devices are more stable because of, inter alia, positioning the connecting portions (that connect the supporting arms and the outer frame) at locations that are more than 50% of the entire length of the device from the second end edge of the base.

BRIEF DESCRIPTION OF THE DRAWINGS

FIG. 5 is an underside plan view of a second embodiment of a crystal frame connected to opposing connecting portions.

FIG. 7A is an underside plan view of a package lid of a second embodiment of a piezoelectric device.

FIG. 7B is an underside plan view of a crystal frame of the second embodiment of a piezoelectric device.

FIG. 7C is a plan view of the package base of the second embodiment of a piezoelectric device.

FIG. 7D is an elevational section of the second embodiment of a piezoelectric device.

DETAILED DESCRIPTION

Figure 1:
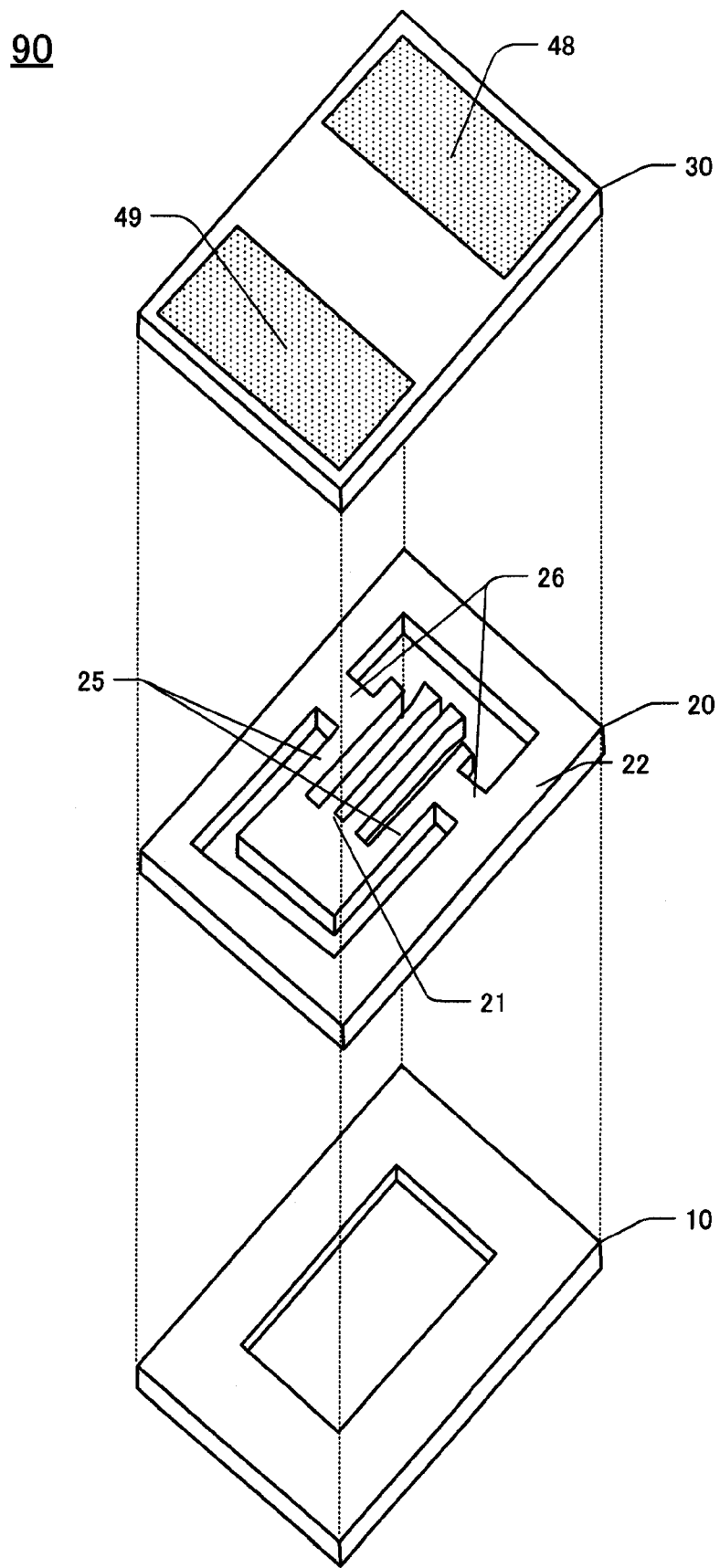
FIG. 1 is an exploded perspective view of an embodiment of a piezoelectric device 90.

As shown in FIG. 1, a first embodiment of a piezoelectric device 90 comprises a package lid 10, a crystal frame 20, and a package base 30. These parts are all formed from respective crystal substrates. The view in FIG. 1 reveals the undersurface of the package base 30. The crystal frame 20 includes a frame portion 22 and a tuning-fork type piezoelectric vibrating piece 21 connected to the frame portion. The tuning-fork type piezoelectric vibrating piece 21 includes vibrating arms. Supporting arms 25 extend laterally, outboard of the vibrating arms, to the frame portion 22 to which the supporting arms are connected by respective connecting portions 26a. In this embodiment the piezoelectric vibrating piece 21, supporting arms 25, connecting portions 26a, and frame portion 22 are all formed integrally from a single unit of crystal substrate. Note that the lid 10 and package base 30 need not be made of a piezoelectric material. In other embodiments the lid and package base are made of glass, for example, as described in other embodiments below.

In this embodiment, the crystal frame 20, tuning-fork type crystal vibrating piece 21, and frame portion 22 are all made integrally from a single piezoelectric (crystal) substrate, with the frame portion 22 surrounding the tuning-fork type crystal vibrating piece 21. Also formed integrally are the connecting portions 26a that connect the supporting arms 25, and hence the tuning-fork type piezoelectric vibrating piece 21, to the frame portion 22. The supporting arms 25 extend outboard of respective vibrating arms. Near their distal ends, the supporting arms 25 are connected to the frame portion 22 by the respective connecting portions 26a. In this embodiment the connecting portions 26a are coupled to the frame portion 22 near one end of the frame portion.

In a second embodiment (see FIG. 5, for example), the crystal frame 50 includes connecting portions 26b that are connected to the frame portion 22 at almost mid-length of the tuning-fork type piezoelectric vibrating piece 21 (and hence mid-length of the frame portion). The package lid and package base are made of crystal material in this embodiment.

A piezoelectric vibrating device 100 according to a third embodiment comprises the crystal frame 20 of the first embodiment, but the package lid 10a and package base 30a are made of glass rather than crystal material. A piezoelectric device of this embodiment is produced by sandwiching the crystal frame 20 between the glass package lid 10a and the glass package base 30a and then bonding these three pieces together.

A piezoelectric vibrating device 110 according to a fourth embodiment comprises the crystal frame 20 of the first embodiment as well as the package lid 10 and package base 30 made of a crystal material as in the first embodiment. The piezoelectric vibrating device 110 is produced by sandwiching the crystal frame 20 between the package lid 10 and package base 10, and then bonding these pieces together.

First Embodiment of Crystal Frame

Figure 2:
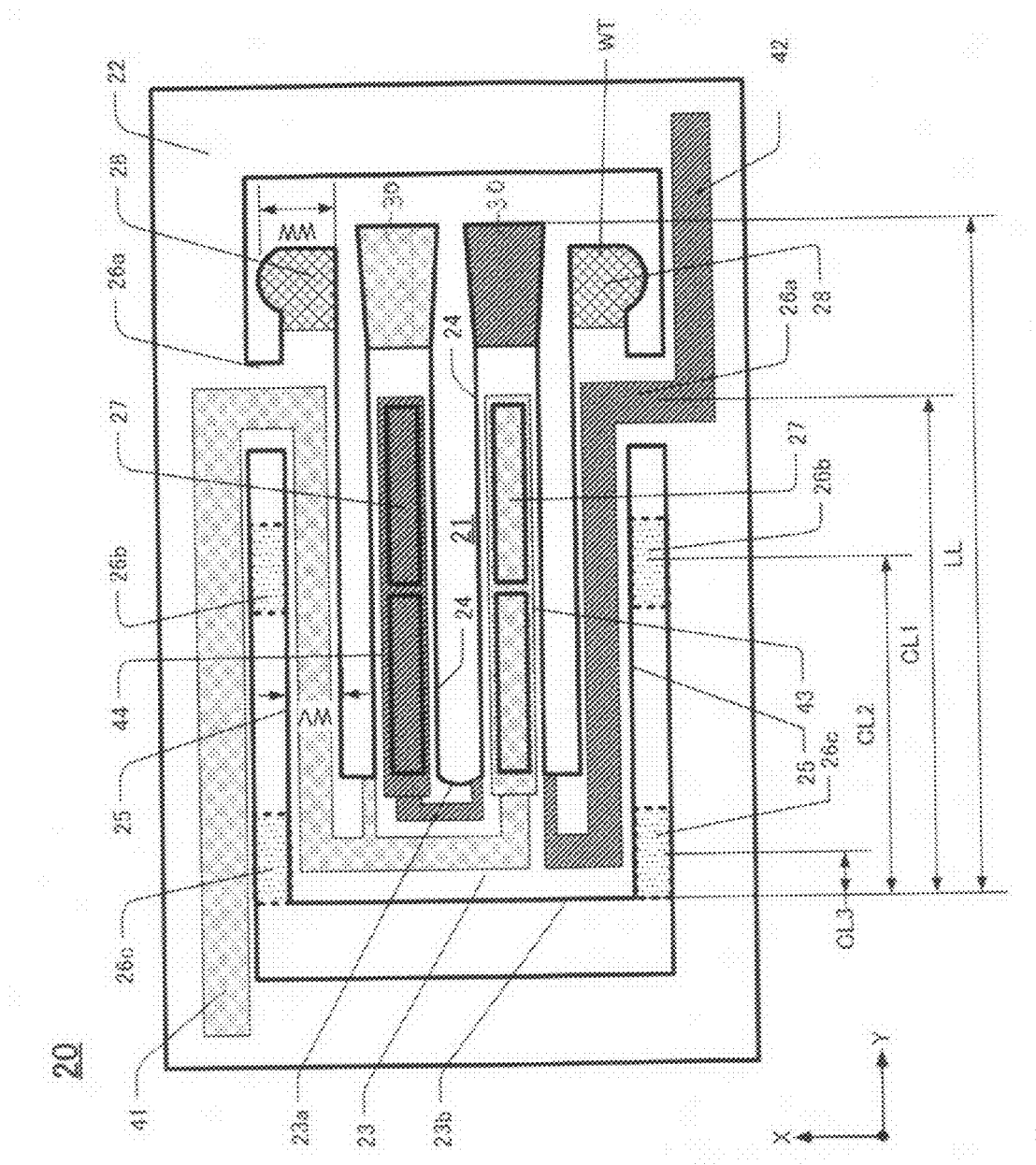
FIG. 2 is an underside plan view of a first embodiment of a crystal frame connected to opposing connecting portions.

FIG. 2 is an underside plan view of the crystal frame 20 of this embodiment, showing several possible locations at which the connecting portions connect to the frame portion. In this embodiment, as described above, the connecting portions 26a are located near the distal ends of the supporting arms 25. The crystal frame 20, made from a crystal substrate having substantially uniform thickness, comprises a tuning-fork type piezoelectric vibrating piece 21 having a base 23 and two vibrating arms 24 extending in the Y-direction from the base, a frame portion 22, supporting arms 25, and connecting portions 26, all being integral with each other. FIG. 2 also depicts alternative configurations involving different locations (dashed lines) of the connecting portions 26. For example, in a first alternative configuration, connecting portions 26b are used that are coupled to the frame portion 22 at about mid-length of the frame portion. In a second alternative configuration, connecting portions 26c are used that are coupled to the frame portion 22 near the other end of the frame portion. If the total length LL of the tuning-fork type piezoelectric vibrating piece 21 is regarded as 100%, the connecting portions 26a of the depicted embodiment are located the distance CL1 from the end 23b of the base 23, wherein CL1 is in the range of 75% to 80% of LL. The first alternative connecting portions 26b are located the distance CL2 from the end 23b of the base 23, wherein CL2 is approximately 50% of LL. The second alternative connecting portions 26c are located the distance CL3 from the end 23b of the base 23, wherein CL3 is approximately 5% of LL. Unless otherwise mentioned in connection with respective locations of attachment to the frame portion 22, the connecting portions are generally denoted as items 26.

When electrically energized, the tuning-fork type piezoelectric vibrating piece 21 of this embodiment oscillates at 32.768 kHz. The X-direction width of the crystal frame 20 is in the range of 0.7 mm to 2 mm, and the Y-direction length is in the range of 1.5 mm to 4 mm. Hence, this is a very small vibrating piece.

The vibrating arms 24 extend, parallel to each other, in the Y-direction from an edge 23a of the base 23. Each vibrating arm 24 has a respective upper major surface and a respective lower major surface. Each of these major surfaces defines at least one respective groove 27, yielding in one embodiment a total of four grooves 27 per pair of vibrating arms 24. A cross-section of a vibrating arm 24 having grooves 27 on its upper and lower major surfaces has a substantially H-shaped transverse profile. The H-shaped profile is effective in reducing the CI of the tuning-fork type piezoelectric vibrating piece 21. Alternatively to one groove per major surface, the major surfaces can include multiple grooves, such as two grooves per major surface as shown in FIG. 2. Hence, the number of grooves per major surface of the vibrating arms desirably is one or more.

Certain configurations may have no grooves. Nevertheless, it has been found that, due at least in part to the particular configurations of the supporting arms, certain no-groove configurations can exhibit stable vibration of the supporting arms 25 with a suitably low CI value.

Each vibrating arm 24 has a distal end on which a "weight" 30 has been formed. The weights 30 progressively increase in X-direction width with decreasing distance to the distal end of the vibrating arms. Each weight 30 is formed as one or more metal layers on the respective major surface near the distal end of the respective vibrating arm. The weights 30 make the vibrating arms 24 oscillate easier whenever a voltage is applied to first and second excitation electrodes 43, 44, respectively. The weights 30 also generally make the arms 24 vibrate in a more stable manner.

On the upper major surface of the frame portion 22, the base 23, the supporting arms 25, and the connecting portions 26, first and second base electrodes 41, 42, respectively, are provided. Similar base electrodes (not shown) are also provided on the lower major surface of these features.

First and second excitation electrodes 43, 44, respectively, are provided on the upper, lower, and side surfaces of each vibrating arm 24. The first excitation electrode 43 is connected to the first base electrode 42, and the second excitation electrode 44 is connected to the second base electrode 42, respectively.

The frame portion 22 is configured, at least in part, to participate in the bonding of the package lid 10 and package base 30 to the upper and lower major surfaces of the frame portion. The frame portion 22 is also connected to the supporting arms 25 at the connecting portions 26, as described above.

The supporting arms 25 extend in respective Y-directions parallel to and outboard of the vibrating arms 24 from respective lateral edges of the base 23 (between the edges 23a, 23b). The supporting arms 25 are configured so as not to transmit or otherwise leak vibrations from the vibrating arms 24 to the outside of the piezoelectric device 90. The supporting arms also reduce the probability of physical damage to the vibrating arms resulting from dropping the device 20 (i.e., impact damage) or from an external temperature change of the package (thermal damage). In the depicted embodiment, each supporting arm 25 include a respective tip area 28 that is located in the +Y direction from the region of the supporting arm 25 at which the connecting portion 26 is attached. This tip area is termed herein a "projecting supporting portion" 28. Each projecting supporting portion 28 has a length that is shorter than the length of the vibrating arms 24.

The connecting portion 26a of the depicted crystal frame 20 is connected to the frame portion 22 at a location that is near the +Y edge of the frame portion 22, almost at the location corresponding to the length LL. With such a configuration, the relative weight of the base 23 side of the crystal frame 20 is increased, which may produce a torque (twisting stress) on each projecting supporting portion 28. Further, whenever the piezoelectric vibrating device receives an external impact, the tuning-fork type piezoelectric vibrating piece 21 can be oscillated with the connecting portion 26a serving as a fulcrum. The projecting supporting portions 28 act as "balancers" to reduce the torque that otherwise would be applied to the connecting portions 26. To facilitate reducing torque in the connecting portions 26 in this manner, each projecting supporting portion 28 can include a respective metal film WT having a width WW that is greater than the width WV of each supporting arm 25.

As noted above, if the entire length LL of the tuning-fork type piezoelectric vibrating piece 21 is 100%, each connecting portion 26a is located the distance CL1 from the end edge 23b of the base 23. The distance CL1 is in the range of 75% to 80% of LL. Locating the connecting portions 26a relatively far from the end edge 23b of the base tends to reduce vibration leakage from the tuning-fork type piezoelectric vibrating piece 21 to the crystal frame 22 and thus improves the CI value of the device. Also, the tuning-fork type piezoelectric vibrating piece 21 is resistant to external influences, so that ΔCI (change in CI) and Δf/f (change in frequency) tend to be minimal with pieces 21 mounted on a circuit board or otherwise used as a piezoelectric device.

Figure 3:
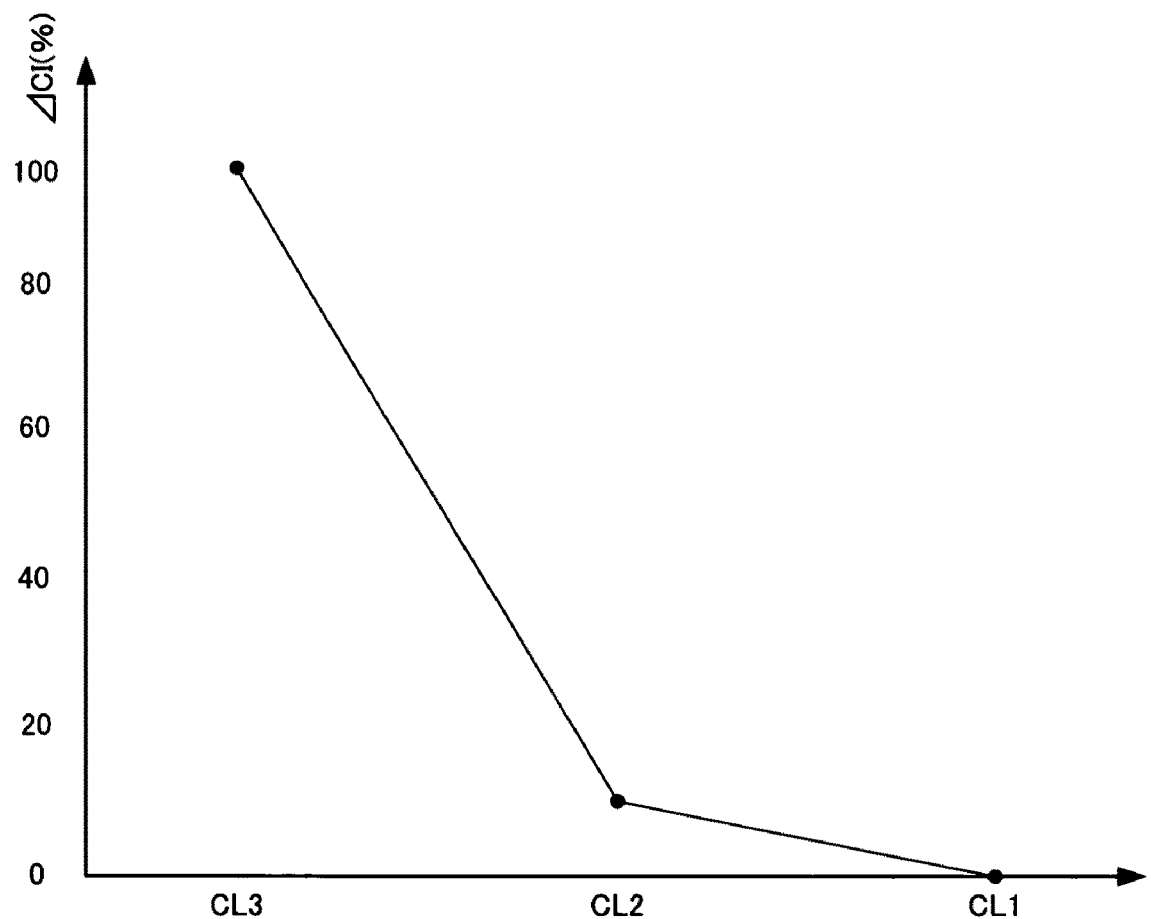
FIG. 3 is a graph showing variations of CI value (ΔCI) exhibited by a piezoelectric device that is surface-mounted on a circuit board.
Figure 4:
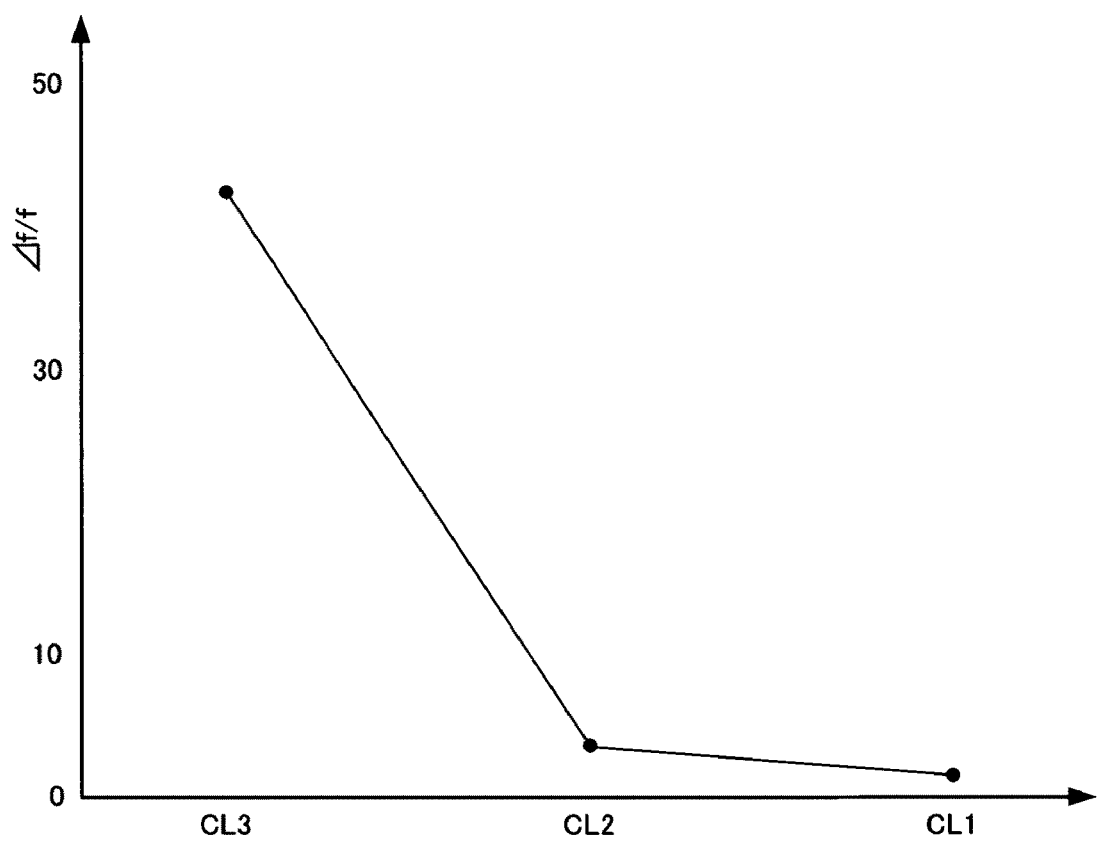
FIG. 4 is a graph showing variations frequency (Δf/f) exhibited by a piezoelectric device that is surface-mounted on a circuit board.

FIG. 3 and FIG. 4 are plots of ΔCI and Δf/f, respectively, exhibited by piezoelectric devices 90 that are surface-mounted on a circuit board (not shown). In FIG. 3, the horizontal axis is distance CL1, CL2, and CL3, and the vertical axis is ΔCI, with the distance CL3 exhibiting a ΔCI value of 100%. The distances CL1, CL2, CL3 correspond to the respective locations of the connecting portions 26a, 26b, 26c on the crystal frame 20. In FIG. 3 the CI change ΔCI is the difference in CI exhibited by the piezoelectric device 90 before and after surface-mounting it on a circuit board such as an epoxy board.

From FIG. 3, it will be understood that the connecting portions 26a being located at the distance CL1 and the connecting portions 26b being located at the distance CL2 do not produce a large ΔCI before and after surface-mounting the piezoelectric device 90. However, locating the connecting portions 26c at the distance CL3 (near the root portion of the respective supporting arm 25) produces a large ΔCI, which indicates a substantial effect after, versus before, surface-mounting and a substantial effect of external changes on operation of the piezoelectric device.

FIG. 4 is a plot of the effect of the distances CL1, CL2, and CL3 on frequency variability Δf/f. The frequency change Δf/f is determined based on vibration frequency exhibited by the piezoelectric device 90 before and after being surface-mounted on a circuit board. From the data in FIG. 4, it will be understood that locating the connecting portions 26a and 26b at respective distances CL1 and CL2 produce relatively low values of Δf/f before and after surface-mounting the piezoelectric device on a circuit board (not shown). However, if the connecting portions 26c are located at the distance CL3, then Δf/f is substantially increased. Thus, the configuration having connecting portions 26c exhibits a substantial change in vibration frequency after being surface-mounted versus before being surface-mounted.

Based on the data in FIGS. 3 and 4, whenever the length LL of the tuning-fork type piezoelectric vibrating piece 21 is 100% and the connecting portions 26 are located more than 50% of LL from the end edge 23b of the base 23, the piezoelectric device 90 exhibits low CI variability and stable frequency when the piezoelectric device 90 is surface-mounted.

As described above, the crystal frame 20 comprises the frame portion 22, the supporting arms 25, and the particular profile of the tuning-fork type piezoelectric vibrating piece 21 (including the grooves 27). On the crystal frame 20 on which the profile and grooves are formed, electrodes are formed using well-known photoresist-etching techniques. Completing these steps completes the manufacture of the crystal frame 20 shown in FIG. 2.

Second Embodiment of Crystal Frame

This embodiment is shown in FIG. 5, and includes a crystal frame 50 comprising a tuning-fork type piezoelectric vibrating piece 21 and a frame portion 22. Connecting portions 26b connect the piezoelectric vibrating piece 21 to the frame portion 22 at the distance CL2 from the end edge 23b of the base 23. This configuration effectively produces data similar to the data shown in FIGS. 3 and 4. Since the crystal frame 50 of this embodiment has substantially the same configuration as the crystal frame 20 of the first embodiment, components of the second embodiment that are the same as corresponding components of the first embodiment have the same respective reference numerals.

In this embodiment, considering the length LL of the tuning-fork type piezoelectric vibrating piece 21 as being 100%, the distance CL2 is about 50% of LL. I.e., the connecting portions 26b are situated at the distance CL2, which is 50% of the length from the end edge 23b of the base 23 to the distal tips of the vibrating arms. Extending from each supporting arm 25 is a projection 29 ("projecting supporting portion") that extends in the Y-direction parallel to the vibrating arms.

The projecting supporting portions 29 are not required for achieving low CI variability (ΔCI) and/or low frequency variability Δf/f when the piezoelectric vibrating device is surface-mounted on a circuit board. However, the projecting supporting portions 29 do provide a balanced support of the tuning-fork type piezoelectric vibrating piece 21. That is, the projecting supporting portions 29 reduce twisting stress in the connecting portions 26b caused by the mass of the tuning-fork type piezoelectric vibrating piece 21. Consequently, in impact or drop tests, the presence of the projections 29 improves resistance to physical impacts.

The projecting supporting portions 29 shown in FIG. 5 are different from the projecting supporting portions 28 shown in FIG. 2. In FIG. 5 the width WV of each supporting arm 25 is equal to the width WW of each respective projecting supporting portion 29, whereas in FIG. 2, WW>WV. Also, a metal film WT is not formed on the projecting supporting portions 29 of FIG. 5. Each projecting supporting portion 29 is no longer than the length of the respective vibrating arms 24, which is sufficient length to ensure a sufficient distance of the projecting supporting portion from the respective connecting portion 26b. As a result, twisting stress (torque) produced at the connecting portion 26b can be reduced by the mass of the projecting supporting portion 29.

The second crystal frame 50 shown in FIG. 5 has two other differences from the embodiment of FIG. 2, besides the positions of the connecting portions 26b. One difference is the shape of the vibrating arms 24 at their distal ends. Another difference is the shape of the supporting arms 25. The vibrating arms 24 in FIG. 5 include "weights" on their distal ends. Each weight has a hammer-head profile in which the width (X-direction) abruptly widens near the distal terminus of the vibrating arm. The maximum width (X-direction) of each hammer-head profile is sufficient to prevent contact of the vibrating arms with each other. As a result of this shape of the vibrating arms, they can vibrate at a designated frequency although the arms are short.

The supporting arms 25 of the FIG. 5 embodiment extend in the X-direction from respective lateral sides 23c of the base 23. Then, each supporting arm 25 extends in the Y-direction outboard of the respective vibrating arm 24. Thus, the respective root of each supporting arm 25 is situated between the supporting arm and the respective portion of the lateral side 23c. In FIG. 5, the supporting arms 25 are coupled to the lateral sides 23c at respective locations that are approximately half the length of the Y-direction dimension of each lateral side. Alternatively, the supporting arms 25 can extend in the X-direction from respective locations on the lateral sides 23c near the proximal end edge 23b of the base, or in the X-direction from respective locations on the lateral sides 23c near the distal end edge 23a of the base.

Third Embodiment; Piezoelectric Device

Figure 6C:
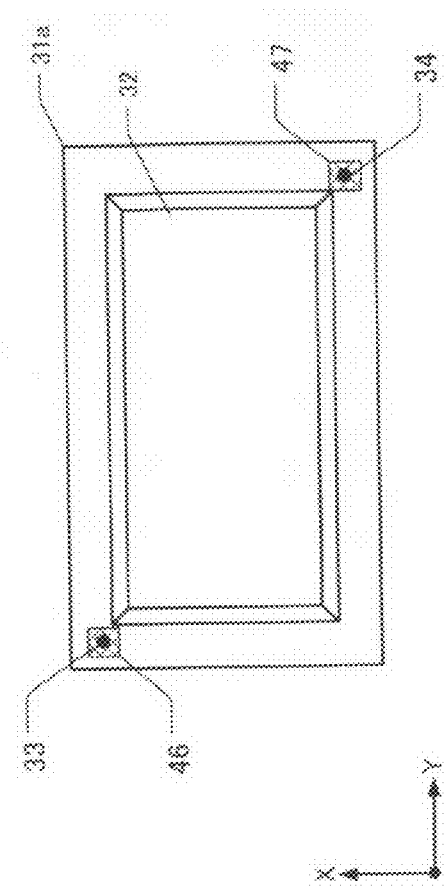
FIG. 6C is a plan view of the package base of the first embodiment of a piezoelectric device.
Figure 6D:
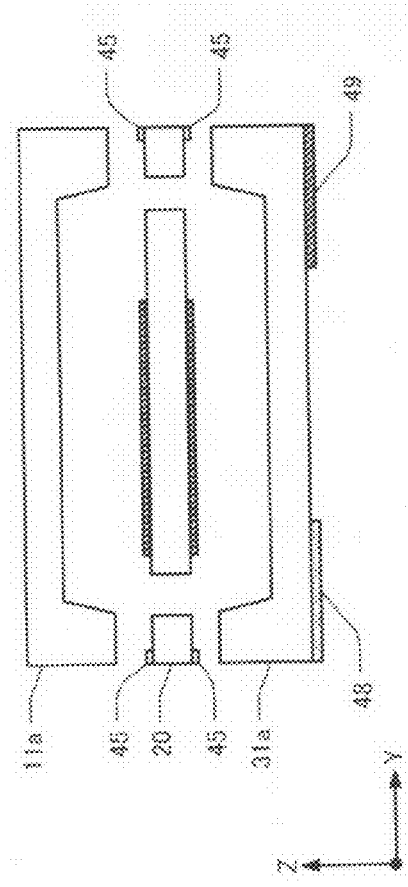
FIG. 6D is an elevational section of the first embodiment of a piezoelectric device.
Figure 6A:
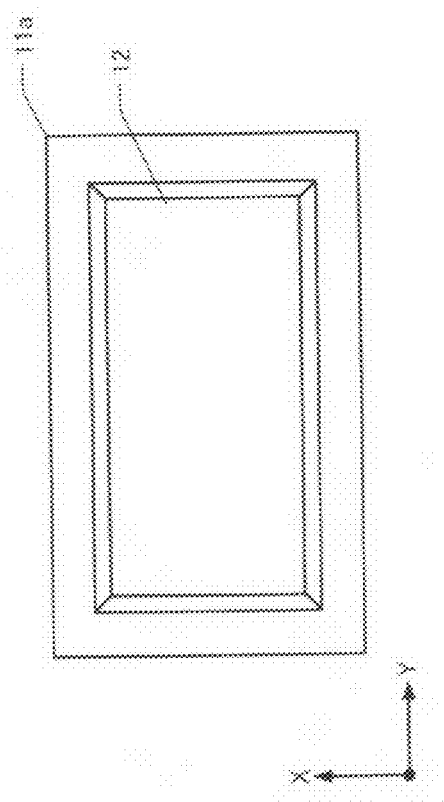
FIG. 6A is an underside plan view of a package lid of a first embodiment of a piezoelectric device.
Figure 6B:
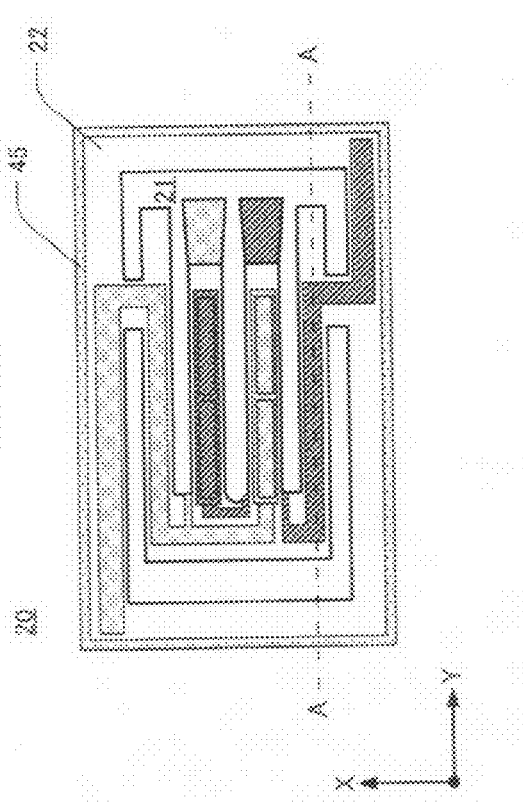
FIG. 6B is an underside plan view of a crystal frame of the first embodiment of a piezoelectric device.
Figure 8:
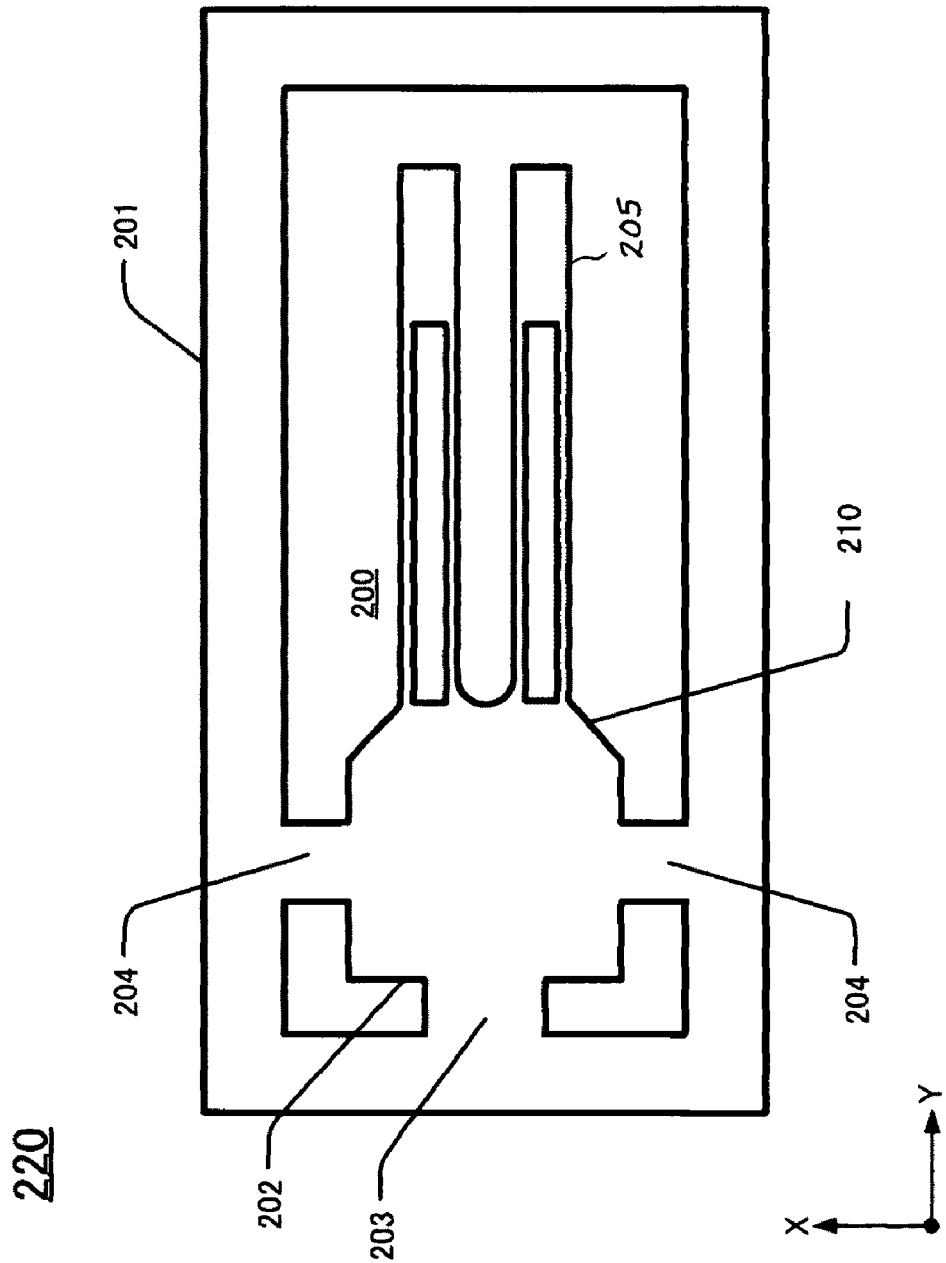
FIG. 8 is a plan view of a conventional tuning-fork type piezoelectric vibrating piece including a frame.

A piezoelectric device 100 according to this embodiment comprises a lid 10 and a package base 30, both made of glass. FIGS. 6A-6D are schematic views of these and other components. The following description refers to the crystal frame 20 of FIG. 2, but reference can also be made to corresponding features on the crystal frame 50 of FIG. 5. FIG. 6A is a plan view of the interior major surface of the lid 11a, and FIG. 6B is an underside view of the crystal frame 20 of the piezoelectric device 100. FIG. 6C is a plan view of the interior surface of the package base 31a of the piezoelectric device 100. FIG. 6D is an elevational section of the piezoelectric device 100.

In the piezoelectric device 100 the frame portion 22 of the crystal frame 20 is sandwiched between the package base 31a and the lid 11a. The package base 31a is bonded to the under-surface of the frame portion 22, and the lid 11a is attached to the upper surface of the frame portion 22.

The lid 11a and package base 31a desirably are made of glass. As shown in FIG. 6A, the lid 11a has a concavity 12 on the interior surface facing the frame portion 22. As shown in FIG. 6B, the crystal frame 20 having connecting portions as discussed in the first embodiment is used. A metal film 45 is located on both the upper and lower surfaces of the frame portion 22. The metal film 45 is formed by sputtering or vacuum-deposition. The metal film 45 comprises an aluminum (Al) layer having a thickness of about 1000 to 1500 Ångstroms.

As shown in FIG. 6C, the package base 31a has a concavity 32 on the interior major surface, facing the frame portion. The package base 31a is made of glass. During formation of the concavity 32 (by etching), a first through-hole 33 and second through-hole 34 are formed simultaneously. The package base 31a also includes a first connecting electrode 46 and second connecting electrode 47 on its external major surface.

The first and second through-holes 33, 34 include a metal film formed on interior surfaces thereof. The metal film can be formed in a photolithography step executed when the first and second connecting electrode 46 and 47 are being formed. The metal film comprises a gold (Au) layer or a silver (Ag) layer. The package base 31a includes a first external electrode 48 and a second external electrode 49, both being metalized on their respective bottoms. The first connecting electrode 46 is connected to the first external electrode 48 on the under-surface of the package base 31a via a first through-hole 33. The second connecting electrode 47 is connected to the second external electrode 49 on the under-surface of the package base 31a via the second through-hole 34.

A first base electrode 41 and second base electrode 42, situated on the under-surface of the frame portion 22 are connected to the first connecting electrode 46 and second connecting electrode 47, respectively, on the upper surface of the package base 31a. Thus, the first base electrode 41 is electrically connected to the first external electrode 48, and the second base electrode 42 is electrically connected to the second external electrode 49.

As shown in FIG. 6D, respective members shown in FIGS. 6A, 6B, and 6C are layered together bonded by anodic bonding to form a piezoelectric device. The lid 11a and package base 31a desirably are made from, for example, Pyrex® glass, borosilicate glass, soda glass, or other glass containing metal ions such as sodium ions. The frame portion 22 is provided with a metal film 45 on its upper and lower surfaces, wherein the metal film 45 desirably is formed of aluminum. On the frame portion 22 containing the tuning-fork type piezoelectric vibrating piece 21 located in the center thereof, the lid 11a is placed on top, with the concavity 12 facing the piezoelectric vibrating piece. The package base 31a is placed on the bottom, with the concavity 32 facing the piezoelectric vibrating piece. Although aluminum is desirably used for forming the metal film 45, the metal film alternatively can be made of a double-layer metal film comprising a layer of gold on a layer of chromium.

The vibrational frequency of the piezoelectric device 100 is adjusted during manufacture. For example, this adjustment may be performed when the package base 31a and frame portion 22 are being bonded by anodic bonding in a vacuum or inert-gas environment. After frequency adjustment, the crystal frame 20, with package base 31a bonded thereto, is bonded to the lid 11a by anodic bonding in a vacuum or inert-gas environment. Then, assembly of the piezoelectric device 100 is completed by sealing the first through-hole 33 and second through-hole 34 with a metal material.

Anodic bonding occurs by a chemical reaction in which the metal layer on a bonding interface is oxidized. For example, for anodic bonding of the frame portion 22 to the lid 11a and package base 31a, the metal film is formed (by sputtering) on both surfaces of the frame portion 22. These metal films are then placed in contact with the bonding surfaces of the two glass members (lid and package base). An electric field is applied between the metal film (as anode) and the surface facing the bonding surface of the glass member (as cathode). The resulting voltage potential causes metal ions (such as sodium) in the glass to move toward the cathode, which oxidizes the metal film contacting the glass material at the bonding interface, resulting in bonding together of both surfaces. In this embodiment anodic bonding is conducted under the following specific conditions established for bonding a metal layer of aluminum. The metal and glass are heated to within the range of 200° C. to 400° C.), followed by application of a voltage potential in the range of 500 V to 1 kV. Thus, the metal and glass are chemically bonded together at the interface.

In FIGS. 6A-6D, one frame portion 22, one lid 11a, and one package base 31a are bonded together. However, in an actual manufacturing process, hundreds or thousands of crystal frames 20, of lids 11a, and of package bases 31a can be formed on respective wafers. The multiple crystal frames are formed on a crystal wafer, and the multiple lids and package bases are formed on respective glass wafers. After forming the frames, lids, and bases on the respective wafers, the wafers are aligned with each other and formed into a sandwich that is bonded together. Thus, hundreds or thousands of piezoelectric devices can be manufactured simultaneously.

Fourth Embodiment; Piezoelectric Device

This embodiment is directed to a piezoelectric device 110 comprising a lid 10 and a package base 30. Reference is made to FIGS. 7A-7D, which are respective schematic views of the lid 10, crystal frame 20, and package base 30, and an elevational view of the device 110, respectively. Description of this embodiment is made with reference to the crystal frame 20 described above. However an alternative crystal frame 50 can be used. FIG. 7A is a plan view of the inside surface of the lid 11b. FIG. 7B is an under-side plan view of the crystal frame 20. FIG. 7C is a plan view of the inside surface of the package base 31b. FIG. 7D is an elevational section of the piezoelectric device of this embodiment.

The piezoelectric device 110 is three-layered, and all three layers are formed of a crystal substrate material. The electrodes, through-holes, and profile outline are as described above regarding the first embodiment of a piezoelectric device 100, so only differences will be explained below. Similar components in both embodiments have the same respective reference numerals.

As shown in FIG. 7B, the crystal frame 20 has connecting portions as used in the first embodiment. In FIG. 7B, the metal film 45 used for bonding together the components of the first embodiment 100 is not needed (since the lid, frame, and package base are all formed of crystal material. Thus, the metal film 45 is not shown in FIG. 7B. Since the lid 11b, frame portion 22, and package base 31b are all formed of the crystal material, they can be bonded together by a siloxane bonding (Si—O—Si) method.

The vibrational frequency of the piezoelectric device 110 is adjusted during manufacture. This adjustment is performed after the frame portion 22 has been siloxane bonded to the package base 31b in a vacuum or inert-gas environment. Then, the lid 11b is placed on the frame portion and bonded thereto by siloxane bonding in a vacuum or inert-gas environment. Manufacture of the piezoelectric device 110 is completed by sealing the first through-hole 33 and second through-hole 34 with a metal material.

To perform siloxane bonding, the bonding surfaces of the frame portion 22, the package base 31b, and the lid 11b are cleaned and then layered with the frame portion being placed between the package base and lid. The resulting sandwich is placed into a high-temperature vessel in which the temperature is in the range of 200° C. to 250° C. Thus, the sandwich is pressurized and heated to bond the pieces together.

For siloxane bonding the bonding surfaces need to be mirror surfaces. Electrodes are used, in the thickness range of 3000 to 4000 Ångstroms, and such electrodes can be a cause of bonding failure. Thus, the lower surface of the frame portion 22 facing the first base electrode 41 and second base electrode 42 desirably has a concavity of which the depth is greater than the thickness of a wiring electrode. A similar concavity is desired also on the upper surface of the package base 31b, having a depth greater than the thickness of the connecting electrodes, so as to accommodate the first connecting electrode 46 and the second connecting electrode 47 on the surface. I.e., the bonding surfaces should have concavities corresponding to the electrodes so as not to interfere with the siloxane bonding.

In FIGS. 7A-7D, one frame portion 22, one lid 11b, and one package base 31b are shown. However, in an actual manufacturing process, hundreds or thousands of frames 20, lids 11a, and package bases 31a can be formed on each of three respective crystal wafers. The wafers are aligned with each other and arranged into a wafer sandwich that is bonded together to form hundreds or thousands of piezoelectric devices simultaneously.

Adjustment of the vibrational frequency in the third and forth embodiments can be conducted, for example, by trimming the connecting portions 36 using a femtosecond-pulse laser. The laser thus removes mass from the connecting portions. The frequency adjustment is conducted after fabricating the connecting portions of the crystal frame, but before fabricating the vibrating arms 24 of the tuning-fork type piezoelectric vibrating piece 21. Hence, the frequency adjustment can be conducted without changing the characteristics of the tuning-fork type piezoelectric vibrating piece 21. In other embodiments, instead of trimming the connecting portions 26 to achieve frequency adjustment, a part of the vibrating arms 24 can be cut and fabricated to allow adjustment of frequency.

The invention has been described above in the context of preferred embodiments. It will be understood by those of ordinary skill in the art that the invention can be varied and/or modified within the scope of this invention. For example, the tuning-fork type piezoelectric vibrating pieces 21 described herein were made of quartz crystal. However, any of various other piezoelectric single-crystal materials alternatively can be used, such as lithium niobate.

What is claimed is:

1. A piezoelectric frame, comprising:
a tuning-fork type piezoelectric vibrating piece comprising a base having a first end edge and a second end edge opposite the first end edge, at least a pair of vibrating arms extending in a first longitudinal direction from the first end edge of the base, and at least one excitation electrode situated on the vibrating arms, the piezoelectric vibrating piece extending length and width in a plane in which the piezoelectric vibrating piece has a designated length in the plane from the second end edge of the base in the first longitudinal direction;
a frame portion situated in the plane in which the frame portion is coupled to and surrounds the tuning-fork type piezoelectric vibrating piece;
a respective supporting arm extending in the plane laterally from the base and in the first longitudinal direction, outboard of and parallel to the respective vibrating arm; and
a respective connecting portion connecting each supporting arm to the frame portion, each connecting portion extending in the plane from the frame portion to the respective supporting arm in a second direction intersecting the first longitudinal direction, the connecting portions being connected to the frame portion and respective supporting arms at designated locations that are more than 50% of the designated length of the tuning-fork piezoelectric vibrating piece from the second end edge of the base.

2. The piezoelectric frame of claim 1, wherein:
each vibrating arm has a designated length to a respective distal-end edge in the first longitudinal direction;
each connecting portion further comprises a respective projecting supporting portion extending therefrom in the plane in the first longitudinal direction; and
each projecting supporting portion extends in the first longitudinal direction a distance in which the projecting supporting portion does not extend past the distal-end edge of the respective vibrating arm.

3. The piezoelectric frame of claim 2, wherein:
each vibrating arm has a respective distal end; and
each distal end includes a weight.

4. The piezoelectric frame of claim 3, further comprising at least one connecting electrode extending on the supporting arms, the connecting portions, and the frame portion, the at least one connecting electrode being electrically connected to a respective excitation electrode.

5. The piezoelectric frame of claim 2, further comprising at least one connecting electrode extending on the supporting arms, the connecting portions, and the frame portion, the at least one connecting electrode being electrically connected to a respective excitation electrode.

6. The piezoelectric frame of claim 1, wherein each projecting supporting portion has a mass that is adjustable to reduce twisting stress in the connecting portions.

7. The piezoelectric frame of claim 6, wherein:
each supporting arm has a first width;
each projecting supporting portion has a second width; and
the second width is different from the first width.

8. The piezoelectric frame of claim 7, wherein:
each vibrating arm has a respective distal end; and
each distal end includes a weight.

9. The piezoelectric frame of claim 8, further comprising at least one connecting electrode extending on the supporting arms, the connecting portions, and the frame portion, the at least one connecting electrode being electrically connected to a respective excitation electrode.

10. The piezoelectric frame of claim 7, further comprising at least one connecting electrode extending on the supporting arms, the connecting portions, and the frame portion, the at least one connecting electrode being electrically connected to a respective excitation electrode.

11. The piezoelectric frame of claim 6, wherein:
each vibrating arm has a respective distal end; and
each distal end includes a weight.

12. The piezoelectric frame of claim 11, further comprising at least one connecting electrode extending on the supporting arms, the connecting portions, and the frame portion, the at least one connecting electrode being electrically connected to a respective excitation electrode.

13. The piezoelectric frame of claim 6, further comprising at least one connecting electrode extending on the supporting arms, the connecting portions, and the frame portion, the at least one connecting electrode being electrically connected to a respective excitation electrode.

14. The piezoelectric frame of claim 1, wherein:
each vibrating arm has a respective distal end; and
each distal end includes a weight.

15. The piezoelectric frame of claim 14, further comprising at least one connecting electrode extending on the supporting arms, the connecting portions, and the frame portion, the at least one connecting electrode being electrically connected to a respective excitation electrode.

16. The piezoelectric frame of claim 1, further comprising at least one connecting electrode extending on the supporting arms, the connecting portions, and the frame portion, the at least one connecting electrode being electrically connected to a respective excitation electrode.

17. A piezoelectric device, comprising:
a piezoelectric frame as recited in claim 1, the frame having an upper surface and a lower surface;
a lid attached to the upper surface so as to cover the piezoelectric frame; and
a package base attached to the lower surface so as to form a sandwich of the frame between the lid and the package base.

18. The piezoelectric device of claim 17, wherein:
the lid and package base are made of a glass material including ions of a metal;
the upper and lower surfaces of the frame comprise respective peripheral regions configured to contact the lid and package base, respectively, in the sandwich, each peripheral region including a metal film; and
the metal films are bonded to the lid and package base, respectively, by anodic bonding.

19. The piezoelectric device of claim 18, wherein:
the lid and package base are each made of a piezoelectric material; and
in the sandwich the piezoelectric frame, lid, and package base are bonded together by siloxane bonding.

* * * * *